US009250516B2

(12) United States Patent
Anderson et al.

(10) Patent No.: US 9,250,516 B2
(45) Date of Patent: Feb. 2, 2016

(54) METHOD OF MAKING A MOLDED TEXTURED IMAGING BLANKET SURFACE

(71) Applicant: Palo Alto Research Center Incorporated, Palo Alto, CA (US)

(72) Inventors: Gregory B. Anderson, Emerald Hills, CA (US); David K. Biegelsen, Portola Valley, CA (US); Michael Y. Young, Cupertino, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 185 days.

(21) Appl. No.: 13/953,658

(22) Filed: Jul. 29, 2013

(65) Prior Publication Data

US 2015/0027332 A1 Jan. 29, 2015

(51) Int. Cl.
*B41C 1/10* (2006.01)
*G03F 7/00* (2006.01)

(52) U.S. Cl.
CPC ............... *G03F 7/00* (2013.01); *B41C 1/1016* (2013.01)

(58) Field of Classification Search
CPC ...... B41C 1/10; B41C 1/1041; B41C 1/1016; B41N 10/02; B41P 2227/70; G03F 7/20; B41J 2/435
See application file for complete search history.

(56) References Cited

U.S. PATENT DOCUMENTS

| 3,285,741 | A |  | 11/1966 | Gesierich |  |
|---|---|---|---|---|---|
| 3,741,118 | A |  | 6/1973 | Carley |  |
| 3,800,699 | A |  | 4/1974 | Carley |  |
| 3,877,372 | A |  | 4/1975 | Leeds |  |
| 4,174,218 | A | * | 11/1979 | Pohl | ............................. 430/306 |
| 5,493,971 | A |  | 2/1996 | Lewis et al. |  |
| 5,701,815 | A |  | 12/1997 | Bocko |  |

(Continued)

FOREIGN PATENT DOCUMENTS

| DE | 10 2008 062741 A1 | 4/2008 |
| EP | 1935640 A2 | 6/2008 |
| EP | 2450190 A1 * | 5/2012 |

OTHER PUBLICATIONS

Shen et al., "A new understanding on the mechanism of fountain solution in the prevention of ink transfer to the non-image area in conventional offset lithography", J. Adhesion Sci. Technol., vol. 18, No. 15-16, pp. 1861-1887 (2004).

(Continued)

*Primary Examiner* — Judy Nguyen
*Assistant Examiner* — Jennifer Simmons
(74) *Attorney, Agent, or Firm* — Ronald E. Prass, Jr.; Prass LLP

(57) ABSTRACT

Forming an imaging blanket for a printing apparatus includes depositing a patternable material over a substrate, etching the patternable material according to a desired exposure pattern, hardening the etched patternable material to thereby form a template surface comprising a desired template pattern of texture features, depositing a layer of curable liquid polymer over and in physical contact with the template surface, curing the liquid polymer to thereby form the imaging blanket, and removing the imaging blanket from the template surface to thereby expose a patterned imaging surface of the imaging blanket. The image blanket may thereby be provided with a desired texture surface, for example comprised of individual molded image blanket features, such as recesses or pillars, of a desired cross-sectional shape. The image blanket is configured for and may be disposed on an image forming member of a variable data lithography system.

19 Claims, 25 Drawing Sheets

(56) References Cited

U.S. PATENT DOCUMENTS

| | | |
|---|---|---|
| 5,819,661 A | 10/1998 | Lewis et al. |
| 5,855,173 A | 1/1999 | Chatterjee et al. |
| 5,890,430 A | 4/1999 | Wirz |
| 6,125,756 A | 10/2000 | Nussel et al. |
| 6,146,798 A | 11/2000 | Bringans et al. |
| 6,318,264 B1 | 11/2001 | D'Heureuse et al. |
| 6,374,737 B1 | 4/2002 | Bennett et al. |
| 6,520,084 B1 | 2/2003 | Gelbart |
| 6,631,679 B2 | 10/2003 | Bennett et al. |
| 6,715,420 B2 | 4/2004 | Blake et al. |
| 6,725,777 B2 | 4/2004 | Katano |
| 7,100,503 B2 | 9/2006 | Wiedemer et al. |
| 7,191,705 B2 | 3/2007 | Berg et al. |
| 2002/0121204 A1 | 9/2002 | Bennett et al. |
| 2003/0000409 A1 | 1/2003 | Blake et al. |
| 2003/0165774 A1 | 9/2003 | Arias et al. |
| 2003/0167950 A1 | 9/2003 | Mori |
| 2004/0011234 A1 | 1/2004 | Figov et al. |
| 2005/0178281 A1 | 8/2005 | Berg et al. |
| 2005/0258136 A1 | 11/2005 | Kawanishi et al. |
| 2007/0199457 A1 | 8/2007 | Cyman, Jr. et al. |
| 2007/0199458 A1 | 8/2007 | Cyman, Jr. et al. |
| 2007/0199459 A1 | 8/2007 | Cyman, Jr. et al. |
| 2007/0199460 A1 | 8/2007 | Cyman, Jr. et al. |
| 2007/0199461 A1 | 8/2007 | Cyman, Jr. et al. |
| 2007/0199462 A1 | 8/2007 | Cyman, Jr. et al. |
| 2007/0258691 A1* | 11/2007 | Charters et al. ............... 385/132 |
| 2008/0029686 A1* | 2/2008 | Gruber et al. .............. 249/114.1 |
| 2008/0032072 A1 | 2/2008 | Taniuchi |
| 2008/0223240 A1 | 9/2008 | Drury |
| 2010/0031838 A1 | 2/2010 | Lewis et al. |
| 2011/0014557 A1* | 1/2011 | Kim ..................... G03G 5/0592 430/56 |
| 2012/0070570 A1* | 3/2012 | Kim et al. ..................... 427/192 |
| 2014/0204171 A1* | 7/2014 | Kanungo et al. .............. 347/225 |

OTHER PUBLICATIONS

Katano et al., "The New Printing System Using the Materials of Reversible Change of Wettability", International Congress of Imaging Science 2002, Tokyo, pp. 297 et seq. (2002).
U.S. Appl. No. 13/095,714, filed Apr. 27, 2011, Stowe et al.
U.S. Appl. No. 13/095,737, filed Apr. 27, 2011, Stowe et al.
U.S. Appl. No. 13/095,745, filed Apr. 27, 2011, Stowe et al.
U.S. Appl. No. 13/095,757, filed Apr. 27, 2011, Stowe et al.
U.S. Appl. No. 13/095,764, filed Apr. 27, 2011, Stowe et al.
U.S. Appl. No. 13/095,773, filed Apr. 27, 2011, Stowe et al.
U.S. Appl. No. 13/095,778, filed Apr. 27, 2011, Stowe et al.
U.S. Appl. No. 13/204,515, filed Aug. 5, 2011, Stowe et al.
U.S. Appl. No. 13/204,526, filed Aug. 5, 2011, Stowe et al.
U.S. Appl. No. 13/204,548, filed Aug. 5, 2011, Stowe et al.
U.S. Appl. No. 13/204,560, filed Aug. 5, 2011, Pattekar at al.
U.S. Appl. No. 13/204,567, filed Aug. 5, 2011, Stowe et al.
U.S. Appl. No. 13/204,578, filed Aug. 5, 2011, Stowe et al.
U.S. Appl. No. 13/366,947, filed Feb. 6, 2012, Biegelsen.
U.S. Appl. No. 13/426,209, filed Mar. 21, 2012, Liu et al.
U.S. Appl. No. 13/426,262, filed Mar. 21, 2012, Liu et al.
U.S. Appl. No. 13/548,134, filed Jul. 12, 2012, Veres et al.
U.S. Appl. No. 13/548,146, filed Jul. 12, 2012, Veres et al.
U.S. Appl. No. 13/548,151, filed Jul. 12, 2012, Veres et al.
U.S. Appl. No. 13/548,155, filed Jul. 12, 2012, Veres et al.
U.S. Appl. No. 13/548,127, filed Jul. 12, 2012, Veres at al.
U.S. Appl. No. 13/548,157, filed Jul. 12, 2012, Veres et al.

* cited by examiner

ROUGHNESS FACTOR

CRATER REPEAT PITCH/SIZE [um] =>   4/2  5/2  6/2  7/2  8/2  9/2  10/2
CRATER WIDTH [um]                   2    3    4    5    6    7    8

|  | | c1 | c2 | c3 | c4 | c5 | c6 | c7 |
|---|---|---|---|---|---|---|---|---|
| HONEY COMB | r1 | 2.5 | 2.6 | 3.1 | 2.6 | 2.1 | 2.1 | 1.9 |
| ROUND | r2 | 2.3 | 3.1 | 2.9 | 2.8 | 2.4 | 2.5 | 1.7 |
| OCTAGON | r3 | 2.7 | 3.0 | 2.7 | 2.8 | 2.2 | 1.9 | 1.9 |
| SQUARE | r4 | 1.1 | 2.8 | 2.8 | 2.7 | 2.2 | 1.4 | 2.3 |

FIG. 13

| CRATER WIDTH [um]=> | HONEY COMB | ROUND | OCTAGON | SQUARE | UNPATT-ERNED | AIR CURED SIDE |
|---|---|---|---|---|---|---|
| 2 | 2.5 | 2.3 | 2.7 | 1.1 | 2.2 | 1.0 |
| 3 | 2.6 | 3.1 | 3.0 | 2.8 | 2.2 | 1.0 |
| 4 | 3.1 | 2.9 | 2.7 | 2.8 | 2.2 | 1.0 |
| 5 | 2.6 | 2.8 | 2.8 | 2.7 | 2.2 | 1.0 |
| 6 | 2.1 | 2.4 | 2.2 | 2.2 | 2.2 | 1.0 |
| 7 | 2.1 | 2.5 | 1.9 | 1.4 | 2.2 | 1.0 |
| 8 | 1.9 | 1.7 | 1.9 | 2.3 | 2.2 | 1.0 |

FIG. 14

METHOD OF MAKING A MOLDED TEXTURED IMAGING BLANKET SURFACE

BACKGROUND

The present disclosure is related to marking and printing systems, and more specifically to an element of such a system having a controlled surface roughness and oleophobicity.

Offset lithography is a common method of printing today. (For the purposes hereof, the terms "printing" and "marking" are interchangeable.) In a typical lithographic process an imaging plate, which may be a flat plate-like element, the surface of a cylinder, or belt, etc., is formed to have "image regions" formed of hydrophobic and oleophilic material, and "non-image regions" formed of a hydrophilic material. The image regions are regions corresponding to the areas on the final print (i.e., the target substrate) that are occupied by a printing or marking material such as ink, whereas the non-image regions are the regions corresponding to the areas on the final print that are not occupied by said marking material. The hydrophilic regions accept and are readily wetted by a water-based fluid, commonly referred to as a fountain or dampening fluid (typically consisting of water and a small amount of alcohol as well as other additives and/or surfactants to reduce surface tension). The hydrophobic regions repel dampening fluid and accept ink, whereas the dampening fluid formed over the hydrophilic regions forms a fluid "release layer" for rejecting ink. Therefore the hydrophilic regions of the imaging plate correspond to unprinted areas, or "non-image areas", of the final print.

The ink may be transferred directly to a substrate, such as paper, or may be applied to an intermediate surface, such as an offset (or blanket) cylinder in an offset printing system. In the latter case, the offset cylinder is covered with a conformable coating or sleeve with a surface that can conform to the texture of the substrate, which may have surface peak-to-valley depth somewhat greater than the surface peak-to-valley depth of the imaging blanket. Sufficient pressure is used to transfer the image from the blanket or offset cylinder to the substrate.

The above-described lithographic and offset printing techniques utilize plates which are permanently patterned with the image to be printed (or its negative), and are therefore useful only when printing a large number of copies of the same image (long print runs), such as magazines, newspapers, and the like. These methods do not permit printing a different pattern from one page to the next (referred to herein as variable printing) without removing and replacing the print cylinder and/or the imaging plate (i.e., the technique cannot accommodate true high speed variable printing wherein the image changes from impression to impression, for example, as in the case of digital printing systems).

Lithography and the so-called waterless process provide very high quality printing, in part due to the quality and color gamut of the inks used. Furthermore, these inks, which typically have very high color pigment content, are very low cost compared to toners and many other types of marking materials. Thus, while there is a desire to use the lithographic and offset inks for printing in order to take advantage of the high quality and low cost, there is also a desire to print variable data from page to page.

One problem encountered is that offset inks have too high a viscosity (often well above 50,000 cps) to be useful in typical variable printing systems such as nozzle-based inkjet systems. In addition, because of their tacky nature, offset inks have very high surface adhesion forces relative to electrostatic forces and are therefore very difficult to manipulate onto or off of a surface using electrostatics. (This is in contrast to dry or liquid toner particles used in xerographic/electrographic systems, which have low surface adhesion forces due to their particle shape and the use of tailored surface chemistry and special surface additives.)

Efforts have been made to create lithographic and offset printing systems for variable data in the past. One example is disclosed in U.S. Pat. No. 3,800,699, incorporated herein by reference, in which an intense energy source such as a laser is used to pattern-wise evaporate a dampening fluid.

In another example disclosed in U.S. Pat. No. 7,191,705, incorporated herein by reference, a hydrophilic coating is applied to an imaging belt. A laser selectively heats and evaporates or decomposes regions of the hydrophilic coating. Next a water based dampening fluid is applied to these hydrophilic regions rendering them oleophobic. Ink is then applied and selectively transfers onto the plate only in the areas not covered by dampening fluid, creating an inked pattern that can be transferred to a substrate. Once transferred, the belt is cleaned, a new hydrophilic coating and dampening fluid are deposited, and the patterning, inking, and printing steps are repeated, for example for printing the next batch of images.

In yet another example, a rewritable surface is utilized that can switch from hydrophilic to hydrophobic states with the application of thermal, electrical, or optical energy. Examples of these surfaces include so called switchable polymers and metal oxides such as $ZnO_2$ and $TiO_2$. After changing the surface state, dampening fluid selectively wets the hydrophilic areas of the programmable surface and therefore rejects the application of ink to these areas.

In general, the dampening fluid is applied as a relatively thin layer over an image plate. A certain amount of surface roughness is required in order to retain the dampening fluid thereover. In some commercially available imaging systems, specific non-printing areas are defined by a surface with an adequate surface roughness targeted to retain the thin layer of dampening fluid. Providing surface roughness is in part a function of the material forming the imaging plate. Metal imaging plates are susceptible to a variety of texturing methods, such as etching, anodizing, and so on.

A family of variable data lithography devices has been developed that use a structure to perform both the functions of a traditional plate and of a traditional blanket to retain a patterned fountain solution for inking, and to delivering that ink pattern to a substrate. See U.S. patent application Ser. No. 13/095,714, incorporated herein by reference. A blanket performing both of these functions is referred to herein as an imaging blanket. The blanket in such devices retains a dampening fluid, requiring that its surface have a selected texture. Texturing of such a structure has heretofore not been optimized.

SUMMARY

Accordingly, the present disclosure is directed to a method of forming, by molding or casting, an imaging blanket having a desired image blanket surface texture comprised of a plurality of image blanket features. The image blanket is removably formed over a textured substrate, and may be removably secured to an image forming member of a variable data lithography system.

According to one aspect of the disclosure, a method of forming an imaging blanket for a printing apparatus comprises: depositing a photolithographically patternable material over a substrate; exposing the photolithographically patternable material to a desired exposure pattern; etching the photolithographically patternable material according to the desired exposure pattern; hardening the etched photolithographically patternable material to thereby form a template surface comprising a desired template pattern of texture features; depositing a layer of curable liquid polymer over and in physical contact with the template surface; curing the liquid polymer to thereby form the imaging blanket; and removing the imaging blanket from the template surface to thereby expose a patterned imaging surface of the imaging blanket.

Implementations of this aspect may also include forming the photolithographically patternable material over a glass substrate. The texture features may be formed to have a substantially similar cross-sectional shape. The cross sectional shape of the texture features may be selected to optimize the specific variables of the system in which the blanket disclosed herein is disposed, such as but not limited to a one or more shapes such as polygons, ovals (including ellipses), and circles. The texture features may be formed as recesses or as pillars. In certain implementations, the texture features are substantially uniformly spaced apart from one another by a spacing of between 1 µm and 5 µm. Alternatively, the texture features may be pseudo-randomly arranged, again with a spacing of between 1 µm and 5 µm. In other implementations, the texture features are formed to have a non-planar surface edge slope profile.

According to another aspect of the disclosure, an imaging blanket for use in a variable data lithography system comprises a polymer body structure having formed therein a repeating pattern of molded image blanket features, each said feature having a selected cross sectional shape, the pattern of molded image blanket features configured in an image-independent pattern.

Implementations of this aspect may also include the image blanket features having a substantially similar cross-sectional shape selected from the group consisting of: squares, octagons, circles, and hexagons. The image blanket features may be formed as recesses or as pillars. In certain implementations, the image blanket features are substantially uniformly spaced apart from one another by a spacing of between 1 µm and 5 µm. In other implementations, the image blanket features are formed to have a non-planar surface edge slope profile. In still other implementations, the image blanket is removably disposed on an image forming member of a variable data lithography system.

According to still further aspects of the present disclosure, the textured substrate may be directly formed by photolithographic processes, etching following resist development, and may include using the substrate so-formed as a master to form sub-masters used for molding the blanket surface. Other variations of use of a master textured surface are also contemplated. Unless otherwise noted the use of the term master herein includes the notion of using a sub-master for the formation of texture in the image blanket.

The above is a brief summary of a number of unique aspects, features, and advantages of the present disclosure. The above summary is provided to introduce the context and certain concepts relevant to the full description that follows. However, this summary is not exhaustive. The above summary is not intended to be nor should it be read as an exclusive identification of aspects, features, or advantages of the claimed subject matter. Therefore, the above summary should not be read as imparting limitations to the claims nor in any other way determining the scope of said claims.

BRIEF DESCRIPTION OF THE DRAWINGS

In the drawings appended hereto like reference numerals denote like elements between the various drawings. While illustrative, the drawings are not drawn to scale. In the drawings:

FIG. 13 is a table of measured roughness factor as a function of feature cross-section shape for various test texture patterns formed on image surfaces according to embodiments of the present disclosure.

FIG. 14 is a table of measured roughness factor as a function of crater width for various test texture patterns formed on image surfaces according to embodiments of the present disclosure.

DETAILED DESCRIPTION

Figure 1:
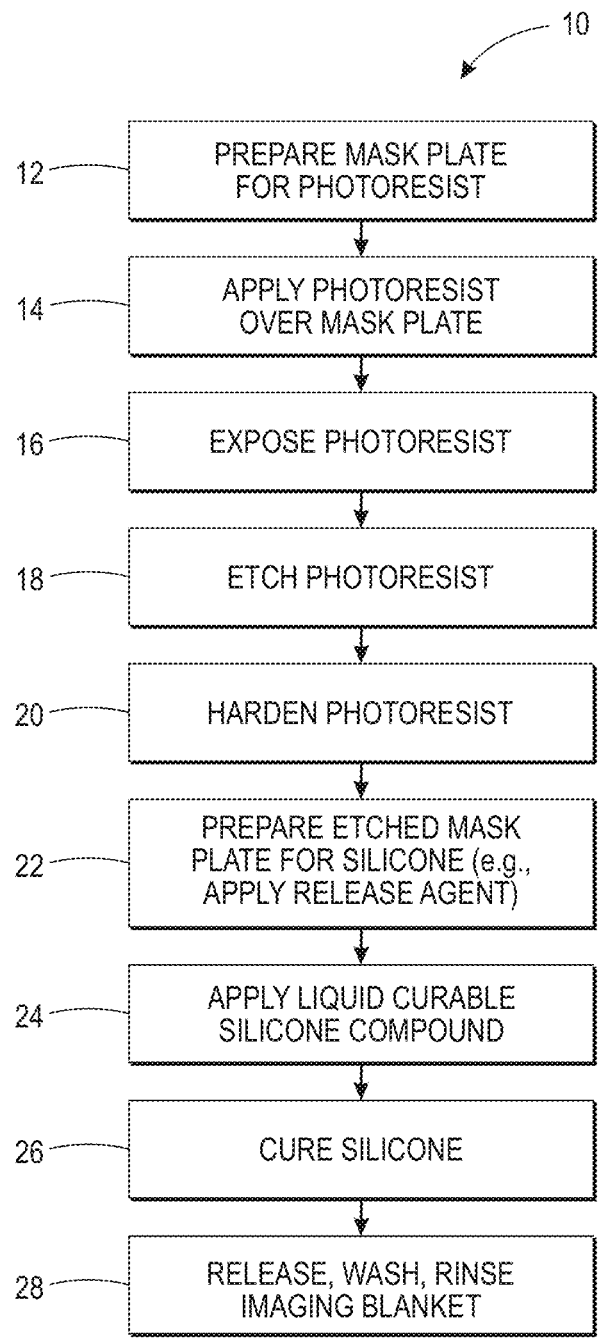
FIG. 1 is a flow diagram illustrating a method of forming a molded image blanket according to an embodiment of the present disclosure.

We initially point out that description of well-known starting materials, processing techniques, components, equipment and other well-known details may merely be summarized or are omitted so as not to unnecessarily obscure the details of the present disclosure. Thus, where details are otherwise well known, we leave it to the application of the present disclosure to suggest or dictate choices relating to those details.

Many of the examples mentioned herein are directed to an imaging blanket (including, for example, a printing sleeve, belt, drum, and the like) that has a uniformly grained and textured blanket surface that is ink-patterned for printing. In a still further example of variable data lithographic printing, such as disclosed in U.S. patent application Ser. No. 13/095, 714, incorporated herein by reference, a direct central impression printing drum having a low durometer polymer imaging blanket is employed, over which for example, a dampening fluid may be formed and inked. Such a polymer imaging blanket requires, among other parameters, a unique specification on surface roughness, radiation absorptivity, and oleophobicity.

The controlled surface roughness has the function of retaining a relatively very thin (for example, on the order of 200 nm) dampening fluid layer for subsequent selective removal, for example by an incident near-infrared (IR) laser beam. Specific patterns of features, features shape and size, and other surface characteristics are formed, such as by molding, into the surface of the polymer imaging blanket.

According to this disclosure, a method of surface texturing a variable data lithography imaging blanket having a polymer body is disclosed. According to certain embodiments, the method comprises polymer surface texturing. The polymer (such as silicone) imaging blankets are often formed by casting. Typical as-cast polymer surfaces have a high surface gloss, especially on the molded face surface.

One method of fabrication involves cast molding where the mold master is fabricated with a photoresist layer patterned using a lithographic process. The molded surface roughness depth is then controlled by the photoresist layer thickness, and exposure and development times, and lateral surface roughness periodicity is controlled by the pattern definition. In one embodiment of such pattern definition, the defined surface pattern can comprise fluid channels to minimize a buildup of bubbles within the dampening fluid.

In some embodiments, it is desirable to provide a polymer imaging blanket having a peak-to-valley surface roughness that is uniform and can retain dampening fluid for greater than 4 seconds. Similarly, in certain embodiments, it is also desirable to have lateral periodic or average aperiodic pitch not exceeding roughly 5 microns (μm), and in certain embodiments 1 μm. Still further, in certain embodiments it is also desirable that the polymer blanket surface retains printing ink but be configured to release it for ink transfer to a paper medium.

Forming an imaging plate by known methods such as using an anodized aluminum surface or using beads on the order of micron-scale can lead to non-uniform surface height variations. According to these known methods, the imaging plate surface may be textured, for example, by ablating the imaging plate surface such as by polishing paper or laser tool. In general, surface uniformity using these methods is not optimal, especially when the lateral periodic structure requirement is in the single digit micron scale. Multimode surface height distributions have been observed for these plate surfaces. These variations in peak-to-valley height can lead to varying thicknesses of dampening fluid which impacts variable data ink printing quality and reliability.

In certain embodiments, slurry with very fine particulates (0.03 microns) is used to obtain a desired texture from a smooth blanket. In a further embodiment, a ground IR absorber (Carbon black) of the desired size (200-400 nm) may be introduced into the imaging blanket material. As it is exposed, through polishing, a desired texture may be obtained.

For certain embodiments of variable data printing, it is desirable to have the imaging blanket bind the oil-based printing ink only minimally so that the deposited ink image can be transferred to paper. Cured polymer material such as Dow Toray SE9187 black silicone (Dow Corning Company) exhibits such oleophobic behavior and minimally binds the printing ink as desired. Dow Toray SE9187 black silicone is a single-component system having a viscosity of 1000 cP. Silicone is one example of an appropriate imaging blanket material, while fluorocarbon elastomer, fluorosilicone rubber, silicone, and other polymers may also be employed. We have found it helpful to dilute this polymer with various diluents (such as Toluene, heptane, and ethanol). For casting, viscosity needs to be less than 300 cps. Other one- or two-component polymer systems can also be engineered to exhibit such oleophobic behavior as well.

Dampening solution has a relatively low viscosity and relatively high surface energy, and therefore tends to fill fine featured, small radius of curvature pits. Inks, by contrast, have relatively high viscosity and low surface energies and therefore tend not to fill pits, but rather span from peak to peak over a bed of trapped air. This creates an effective interfacial energy that is a spatial average of the blanket/ink and air/ink interfacial energies. Thus, the surface texture can be chosen depending on the surface energies and rheologies of the two fluids so as to optimize their differential behaviors.

The textured surface polymer imaging blanket should be capable of absorbing electromagnetic radiation energy to vaporize a very thinly coated dampening fluid layer, for example to form ink receiving regions, during printing. Therefore, according to certain embodiments, the polymer system may further incorporate carbon powder or carbon nanotubes with a near-surface loading concentration of about 3 to 25 percent by weight to facilitate the surface absorption of electromagnetic radiation energy.

As was mentioned previously, it is desirable to have a textured blanket surface with uniform peak-to-valley height. According to one embodiment disclosed herein, this can be accomplished by forming an imaging blanket surface using a textured mold, copying the textured surface from the mold to the imaging blanket. Fine lateral periodic structures and controllable peak to valley heights may thereby be obtained.

According to an embodiment disclosed herein, a textured mold is formed using conventional photolithography methods to enable the fabrication of polymer printing test blankets. Dampening fluid retention ability and inking ability of the textured imaging blanket surface is improved as compared to known imaging plate surface formation methods.

An exemplary method 10 according to this embodiment is illustrated in FIG. 1. At step 12 of method 10 a template plate is prepared to receive photolithographically patternable material. In one example, the template plate may be glass, while other materials may also be used as will be appreciated. At step 14, a layer of photolithographically patternable material (e.g., photoresist) is applied over the glass plate. Example photoresists include Microposit S1800 series photoresist (positive photoresist) and Microchem SU-8 series photoresist (negative photoresist) while other photoresists may also be employed. The photoresist may be negative or positive, depending on the exposure method and other implementation preferences. The photoresist is next exposed at step 16 to a desired exposure pattern. Exposure may be by way of mask, direct exposure (e.g., laser patterning), or other appropriate method. In one specific embodiment, UV exposure may be employed. The photoresist is next etched, at step 18, to form a desired template pattern. Appropriate etchants will be dictated by the photoresist employed and other implementation preferences. At step 20, the etched photoresist pattern is hardened, such as by exposure to a prescribed dosage of ultraviolet radiation to form a template surface. The template plate with etched and hardened photoresist layer is next prepared at step 22 for receipt of layer of polymer material which will form the imaging blanket surface, for example by cleaning and applying a layer of material to assist with release of the polymer, such as a thin layer of Parylene (on the order of 1 microns thick).

According to one variation of the above, following development of the photoresist material, etching is performed so as to etch into the template plate surface, using the patterned photoresist as a mask. The photoresist may be hardened and left in place, or removed such that the patterned template plate surface itself becomes the mold surface.

In addition, in either the case of hardened photoresist or etched template plate (or both), the resulting mold may be a master from which multiple submaster molds may be formed. In such a case, the master pattern must be inverted so that the submaster has the desired topography. The submaster molds may be cast structures of a material suitable to retail the texture detail from the master, and provide that texture detail for subsequent use as a mold for the imaging blanket material.

At step 24 a curable blanket compound, such as the aforementioned silicone compound in liquid form, is applied over the template surface. (Again, alternative materials include certain fluoropolymer elastomers and synthetic rubber materials, such as Viton, from DuPont, Inc., and other similar materials.) To permit flow of the polymer compound into the interstices of the template surface, the viscosity of the polymer is controlled, e.g., to on the order of 300 cps, by the addition of selected additives. Further, the casting or embossing can be performed in an evacuated zone to avoid air capture and enhance capillary filling of the mold. At step 26 the liquid polymer compound is cured, such as at room temperature or elevated temperature, overnight for such time and under such conditions as the specific polymer compound warrants, or using ultraviolet (UV) irradiation to promote crosslinking. The cured polymer imaging blanket is then removed from the template plate, washed, and rinsed at step 28. The polymer imaging blanket may then be disposed on an appropriate carrier in a printing system, described further below. In certain applications the template plate with prepared etched and hardened photoresist layer may be reused to produce additional polymer imaging blankets, while in other applications the photoresist layer or both the photoresist layer and plate are single-use only. The photoresist layer can be formed on a transparent cylinder or belt and used to emboss an uncured or partially cured blanket surface. UV irradiation through the master or through the plate can cure the blanket before it is peeled from the master. This can be part of a roll to roll process.

Figure 2:
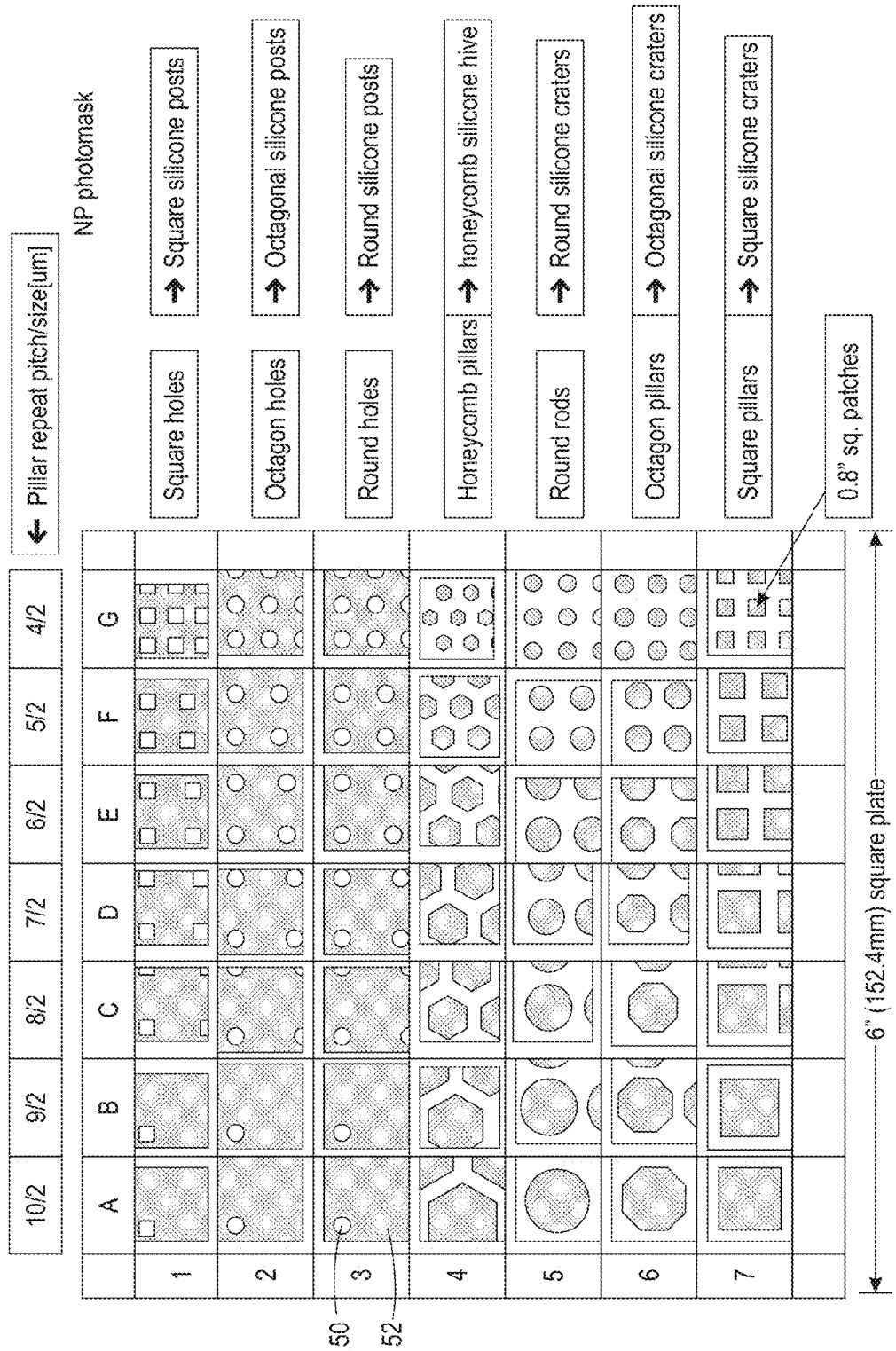
FIG. 2 is a plan view of a patterned cast master including a number of test regions for testing various texture features according to an embodiment of the present disclosure.
Figure 3:
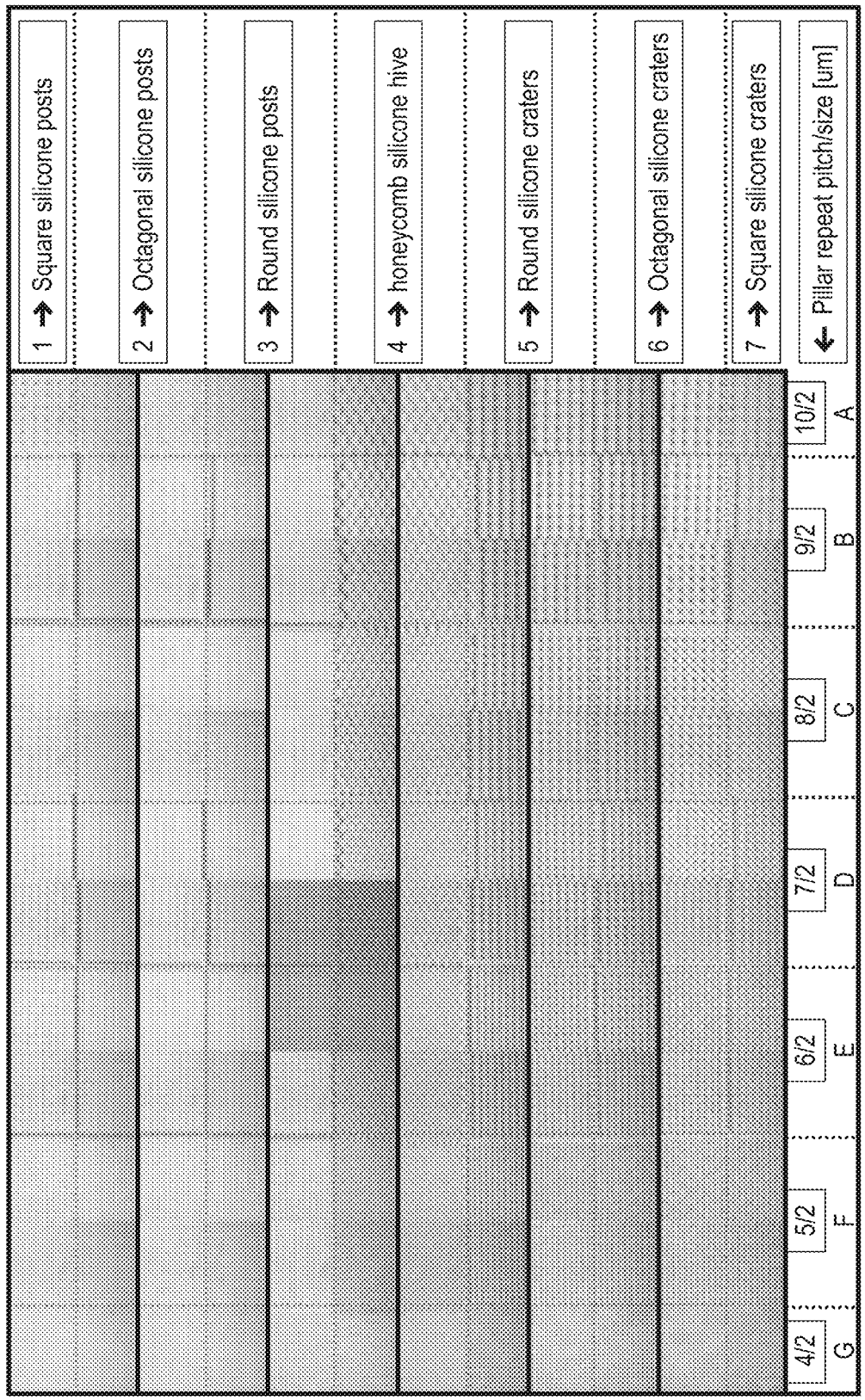
FIG. 3 is an image of the patterned cast master shown in greater detail in FIG. 2.
Figure 4A:
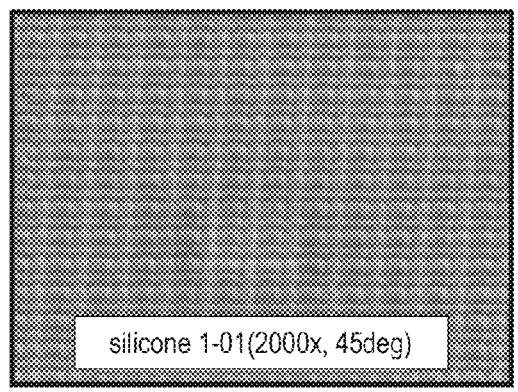
FIGS. 4A through 4H are scanning electron microscope (SEM) images at a 10 µm scale of various image surfaces of image blankets formed by the molding processes disclosed in the present disclosure.
Figure 4B:
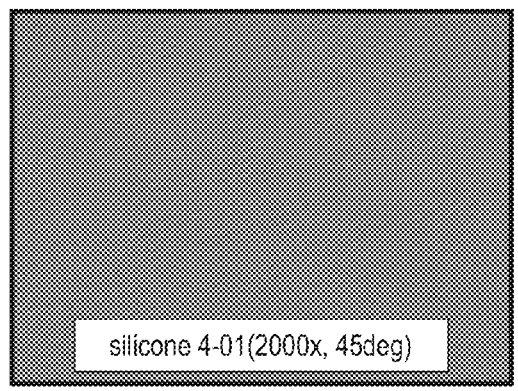
Figure 4C:
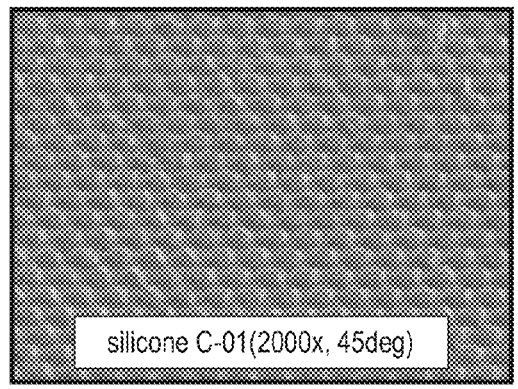
Figure 4D:
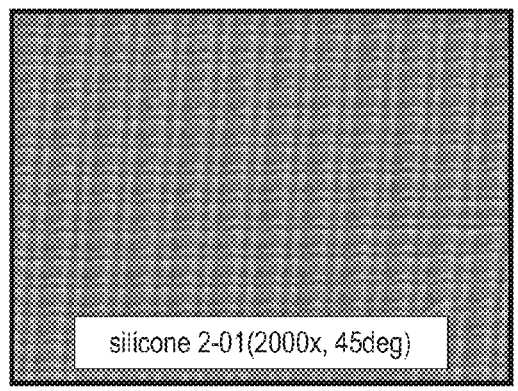
Figure 4E:
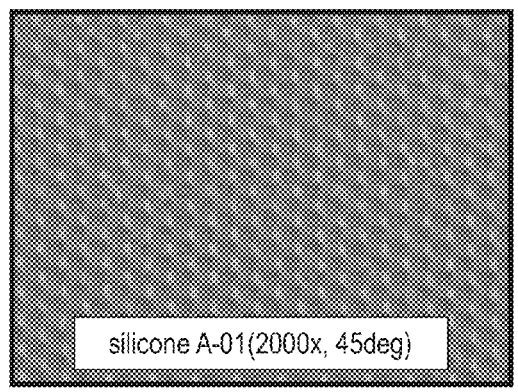
Figure 4F:
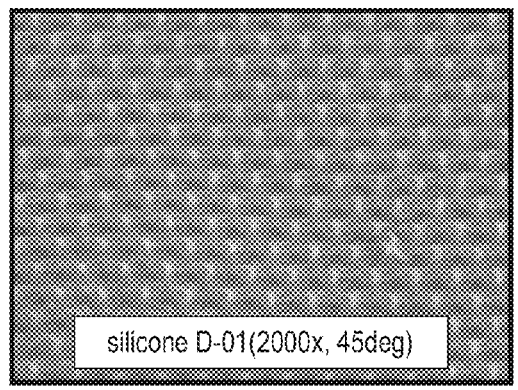
Figure 4G:
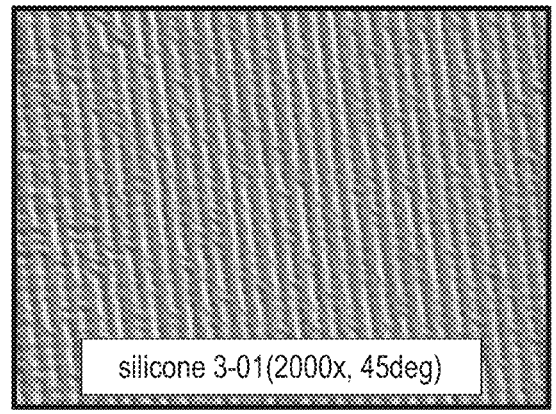
Figure 4H:
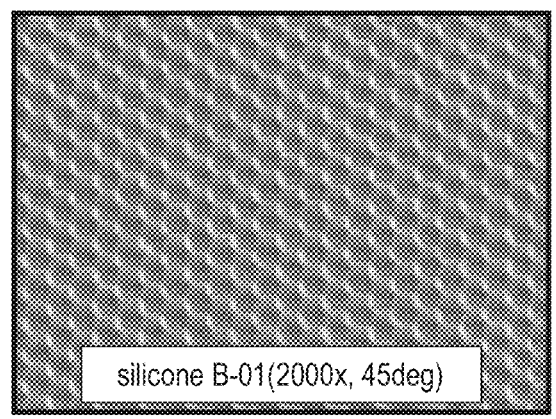
Figure 5A:
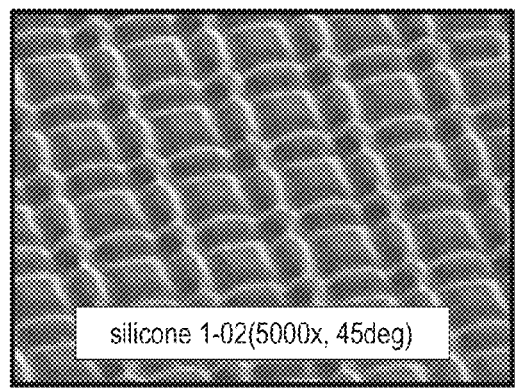
FIGS. 5A through 5H are scanning electron microscope (SEM) images at a 1 µm scale of the various image surfaces of image blankets shown in FIGS. 4a through 4H, respectively.
Figure 5B:
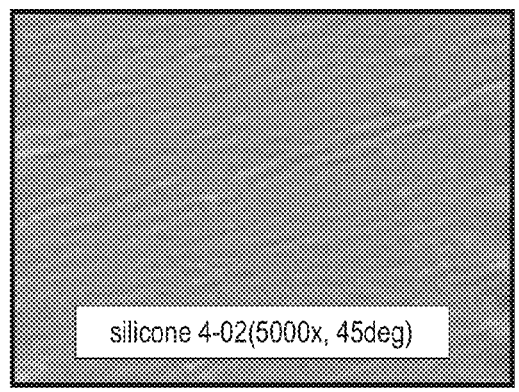
Figure 5C:
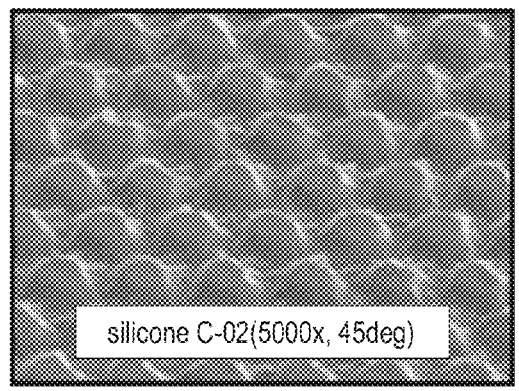
Figure 5D:
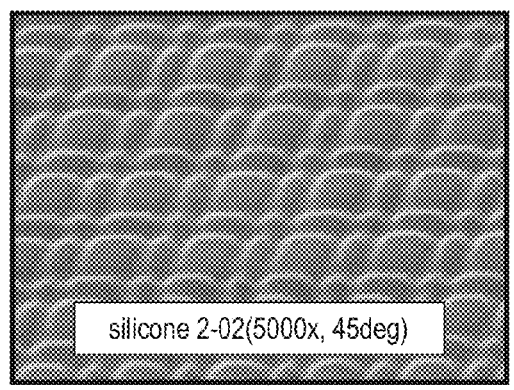
Figure 5E:
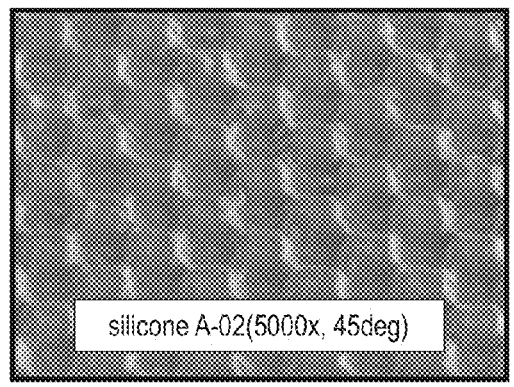
Figure 5F:
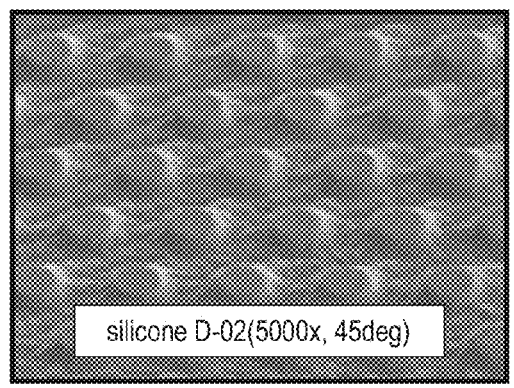
Figure 5G:
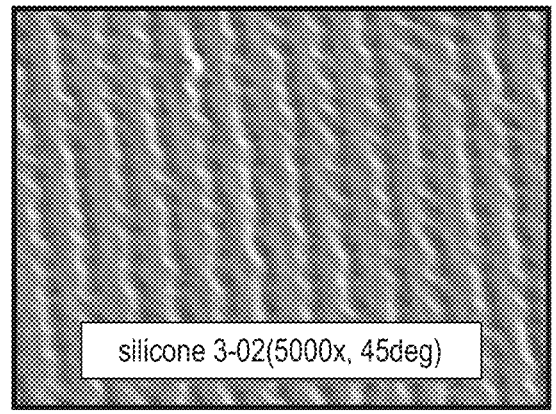
Figure 5H:
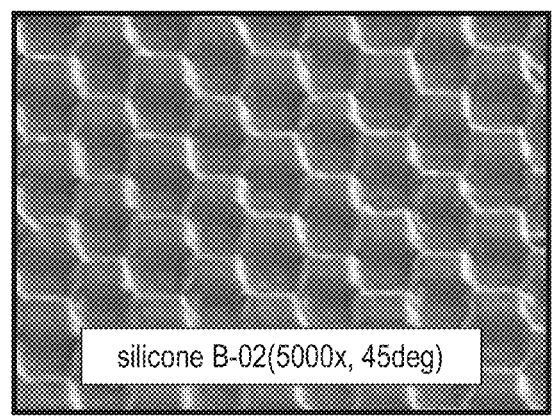
Figure 6A:
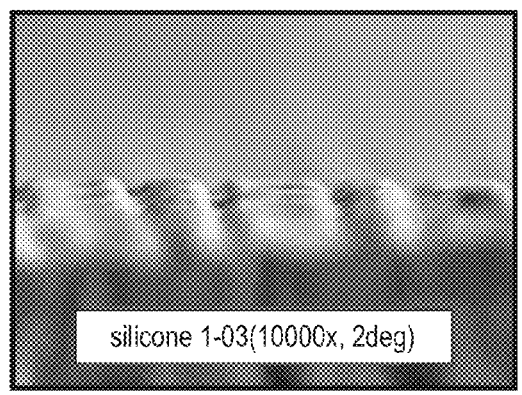
FIGS. 6A-6H are edge-view SEM images of the textured silicone surfaces of the samples shown in FIGS. 4A through 4H and FIGS. 5A through 5H.
Figure 6B:
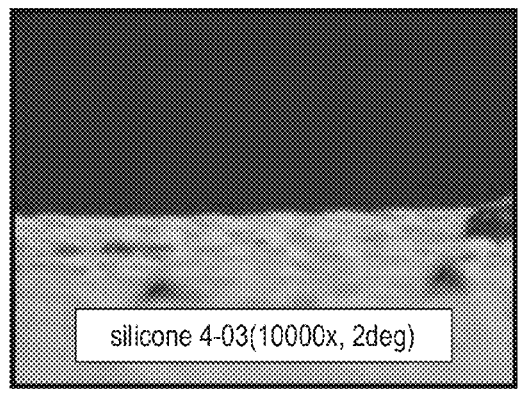
Figure 6C:
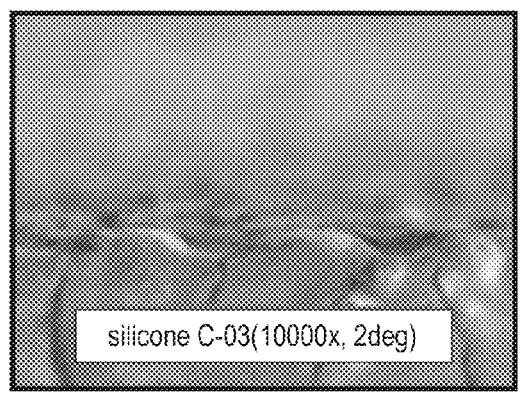
Figure 6D:
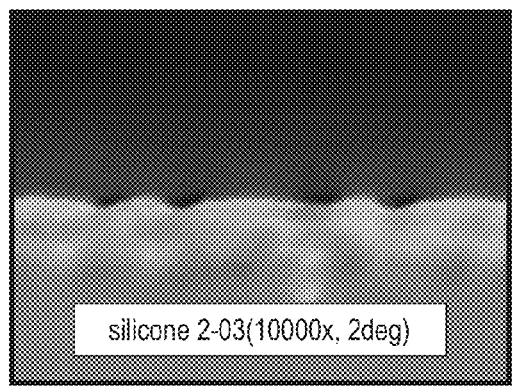
Figure 6E:
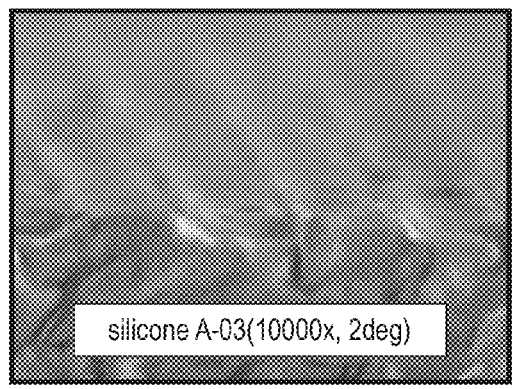
Figure 6F:
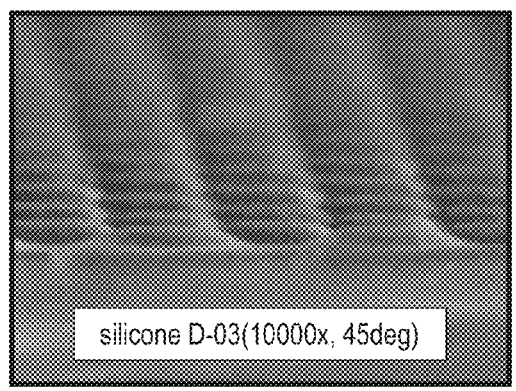
Figure 6G:
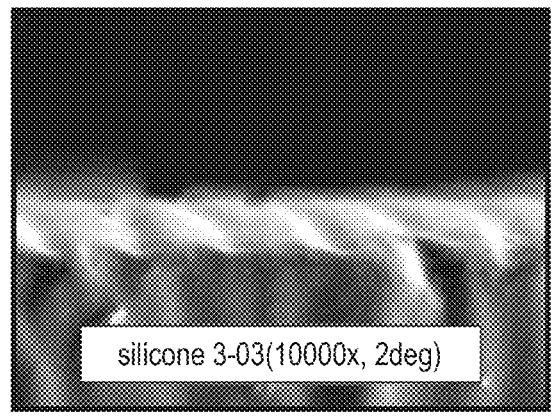
Figure 6H:
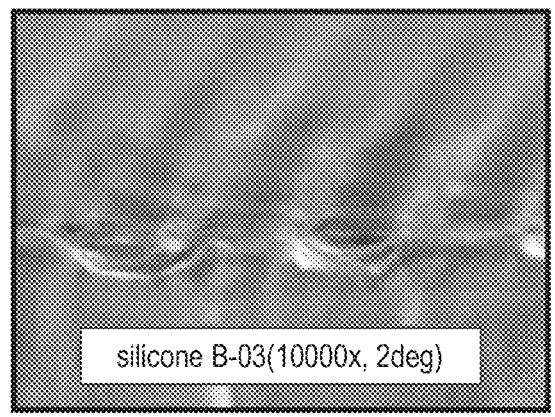

A prototype study was performed, using a variety of plates, each having a selected texture pattern and pitch, as illustrated in FIGS. 2 and 3. These plates form casts for molding one or more imaging blankets, and therefore may be referred to as cast masters herein. FIG. 2 is a close-up view of the features, and FIG. 3 is a map illustrating the texture pattern closer to actual scale. It will be noted that the columns of the array of FIGS. 2 and 3 are grouped by pitch (μm) over feature height (or depth). (All features were 2 microns (μm) in height.) For example 10/2 represents a pillar repeat pitch of 10 and feature height (depth) of 2 μm. These cast masters were used to study dampening fluid retention ability and inking ability of the various textured imaging blanket surfaces. The initial design had a minimum designed feature size of two microns. The patterns illustrated in FIG. 2 are each a 0.8″ square texture test patch, all of which being arranged on a six inch square photomask. Four feature shapes (square, octagon, round, and honeycomb) were explored in this test. Pillars (rods) and holes on the photomask represent the two mask polarities that are possible. The design features' lateral periodic pitch was varied from 10 μm down to 4 μm.

Features formed in the photoresist may be referred to as texture features, while features molded from these texture features to form the image blanket may be referred to as molded image blanket features or simply image blanket features. Texture features were formed to have a generally planar surface, although such texture features, and in turn the image blanket features, may have controlled surface edge slope profiles. Such profiles may be provided for all texture features, or selected texture features (such as those at selected locations, e.g., near the periphery, of the cast master). Texture features, and hence image blanket features, do not correspond directly to elements of an image to be printed, for example they are not letters, or images per se. Indeed, their small feature width highlights this. Nor do the features correspond to pixels that comprise an image to be printed. Rather, they form the general, and in certain embodiments uniform, surface topography of the image blanket used to enable variable data lithography. Accordingly, we refer to the pattern of texture features, and hence image blanket features, as an image-independent pattern.

The shaded area represents chrome features on the photomask which correspond to the dampening fluid holding area on the to-be-formed polymer imaging blanket surface if a positive photoresist is used for the master. The opposite correspondence results if a negative photoresist is used. The white area represents the area with no chrome on the photomask, and will be the polymer dam ribs separating dampening fluid holding areas. A fill factor can be calculated for each design patch, which is the ratio of dampening fluid filled area to the overall unit area. A photomask image (with the texture test patches) was successfully transferred from photomask to a polymer imaging blanket by the liquid polymer application process described above with regard to FIG. 1.

FIGS. 4A-4H are SEM images at a 10 μm scale, and FIGS. 5A-H are SEM images at a 1 μm scale, of a textured silicone surface formed by the process described above. FIGS. 6A-6H are edge-view SEM images of the textured silicone surface of the samples shown in FIGS. 4A-4H and FIGS. 5A-5H. The patterned photoresist template had a controlled thickness on the order of 0.5 μm over the glass plate. Certain areas of the surface of the silicone imaging blanket were found to perform well with dampening fluid wetting and ink testing. Higher resolution silicone crater features with a 2 μm crater dam width and a 5 μm lateral periodic pitch (see FIG. 2) was found to perform well for holding the test dampening fluid for an extended process time of at least 4 seconds. This extended dampening fluid retention time is important to allow for the step of laser evaporation of the dampening fluid and the selective inking step for a digital printing press system of the type of interest herein.

Figure 7A:
FIGS. 7A through 7C are SEM images of various image surfaces having a dampening fluid applied thereover in order to evaluate fluid retention by various feature patterns according to embodiments of the present disclosure.
Figure 7B:
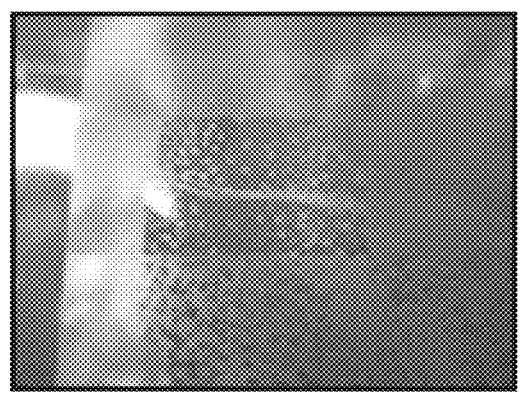
Figure 7C:
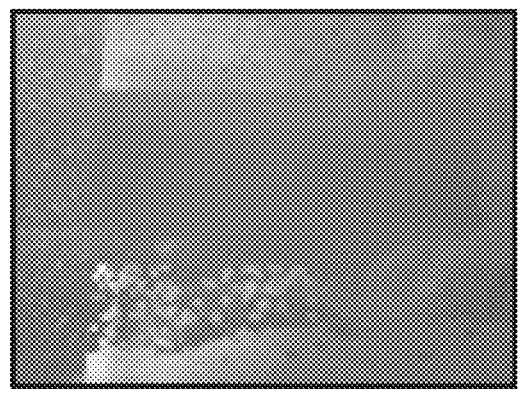

Dampening fluid retention was tested by applying a typical solution (e.g., water, with 5% alcohol added) to the patterned test surface described above. Fluid retention was photographically captured some time after its application (approximately 10-20 seconds), as illustrated in FIGS. 7A-7C. These figures illustrate that different patterns in the silicone cause the fluid to wet, pin, and evaporate differently. It is desired to have uniform wetting and pin the fountain solution, as shown in FIG. 7A. FIGS. 7B and 7C show surfaces exhibiting undesirable pinning or pooling of the solution.

Figure 8:
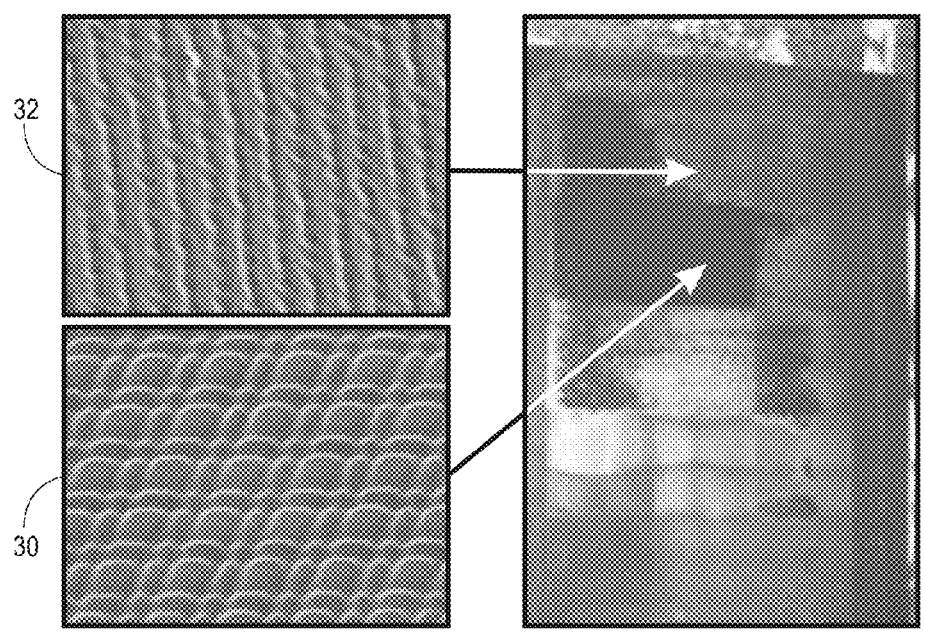
FIG. 8 are SEM images of portions of a test image surface and an image of the test image surface having dampening fluid applied thereover, according to aspects of the present disclosure.

Ink was then applied over the structure, including retained dampening fluid, as illustrated in FIG. 8. The ink was applied via a hand anilox roller. Ink thickness was approximately 1 μm. Thickness of the fountain solution depends on the underlying structure, in this case 0.5 μm. As can be seen, the textured silicone surface regions 30 having a controlled and well defined height of 0.5 μm (corresponding to the photoresist thickness on the glass master mold) were found to have good ink wetting, while the regions 32 with less well defined height (for example due to less than optimal image UV exposure) were found to have poor ink wetting (or non-wetting).

Figure 9A:
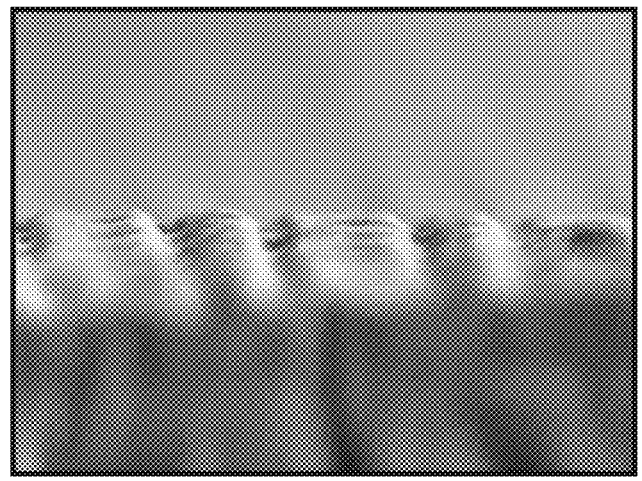
FIGS. 9A and 9B are edge-view SEM images of textured silicone surfaces formed from a controlled 0.5 µm photoresist thickness on the glass master template according to embodiments of the present disclosure.
Figure 9B:
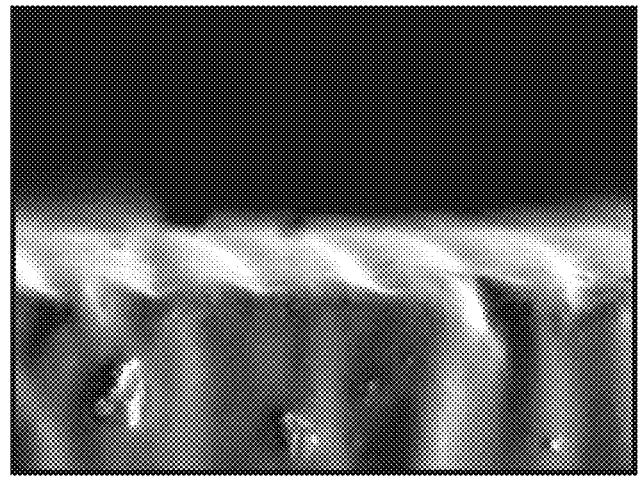

FIGS. 9A and 9B are edge-view SEM images of textured silicone surfaces formed from a controlled 0.5 μm photoresist thickness on the glass master template. Again, silicone surface regions with well-defined heights, such as illustrated in FIG. 9A, were found to have good ink wetting while less well defined height regions, such as illustrated in FIG. 9B, were found to be ink non-wetting. (Scale bar is 1 μm.)

Figure 10:
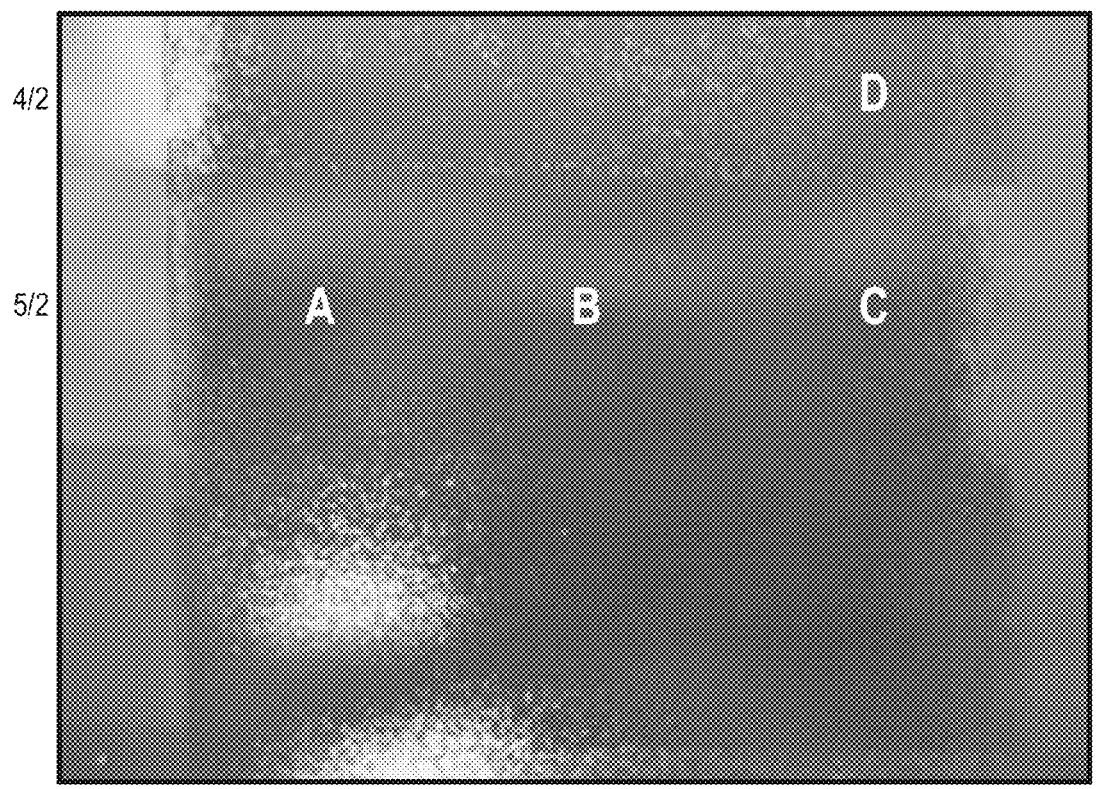
FIG. 10 is an image of a test image surface having ink applied thereover, illustrating ink acceptance of various different texture patterns on the test surface according to embodiments of the present disclosure.

FIG. 10 is a further illustration of ink acceptance on the prototype textured plate. The row designations in FIG. 10 represent crater dam width and pitch. For example, all regions in the row labeled 5/2 have a 5 μm lateral periodic repeat pitch and a 2 μm crater dam width, and all regions in the row labeled 5/4 have a 4 μm lateral periodic repeat pitch and a 2 μm crater dam width. It can again be seen that regions having a better-defined texture pattern, such as those of row 2/5, demonstrate greater ink retention as compared to smaller and more poorly defined textures.

Figure 11:
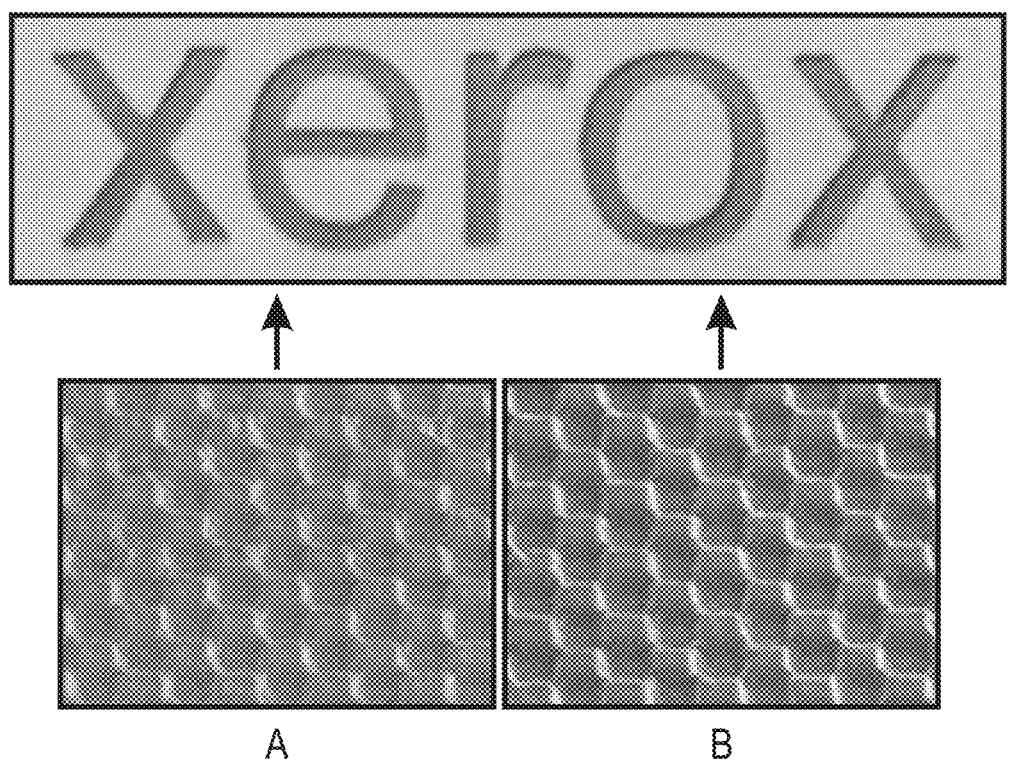
FIG. 11 is a test print image (logo) and SEM images of corresponding regions of the imaging surface used to form that test print image according to embodiments of the present disclosure.

FIG. 11 illustrates a printing sample in which an image was formed over a textured polymer imaging surface formed by a process described above. A dampening fluid was applied over the textured imaging surface, and the patterned formed in the solution by digital lithography. The imaging surface was then inked to form a reverse image, and the reverse image applied to a paper substrate. The imaging surface was formed to have roughly a 0.5 μm peak-to-valley height, with a honeycomb (hexagonal) texture pattern. As can be seen, the image comprises well-defined printed ink edges and robust ink solid areas. Texture pattern A has less-defined features than texture pattern B. The printed image shows better line definition in the print for texture pattern B.

Figure 12:
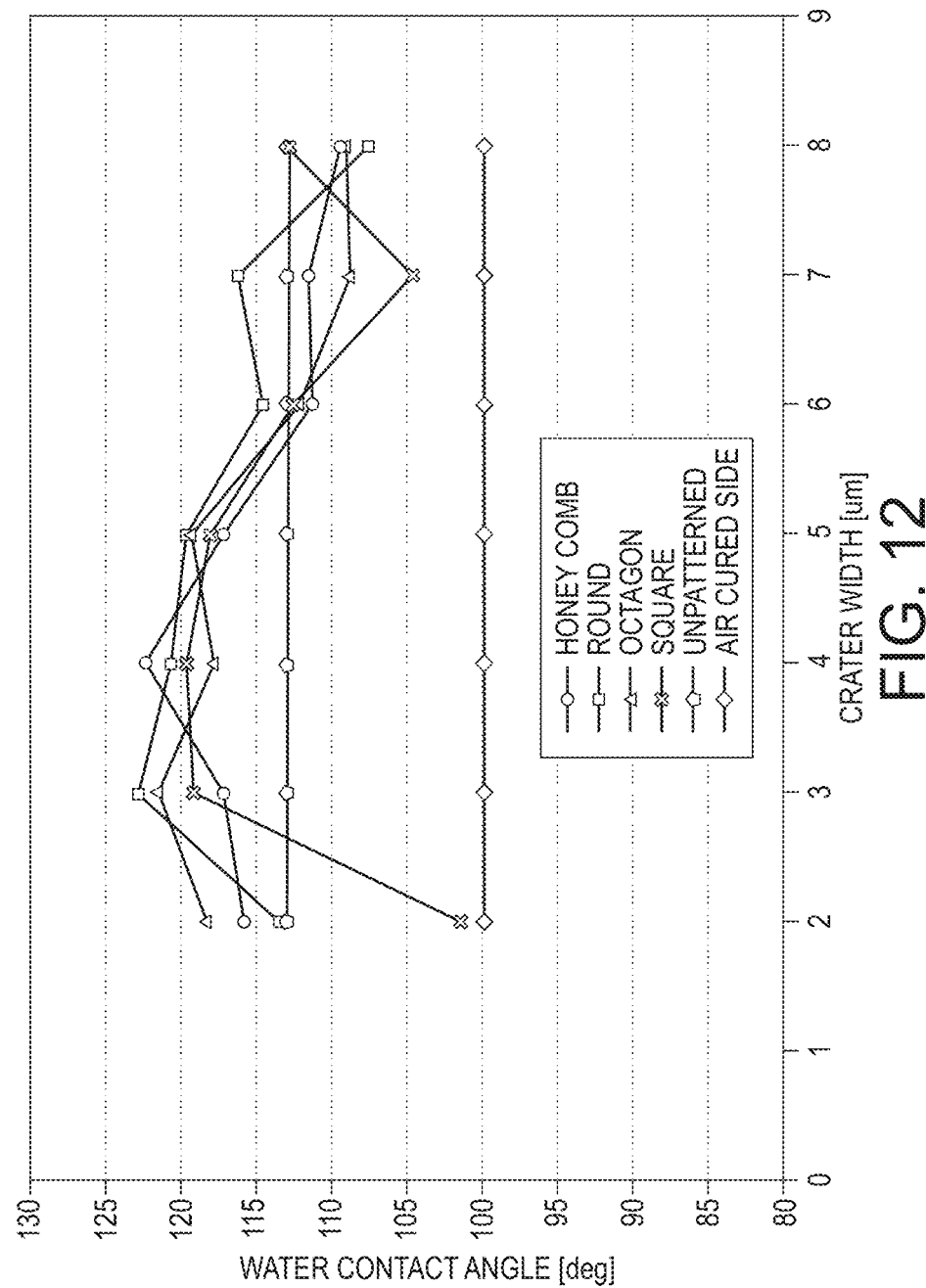
FIG. 12 is a graph of contact angle plotted against crater width for various test texture patterns formed on image surfaces according to embodiments of the present disclosure.

Additional studies have been performed to investigate dampening fluid retaining capability. In one such study, water contact angle was measured for various texture shapes. Results from this study are illustrated in FIG. 12, from which it can be seen that the texturing shapes (honey comb, round, octagon, square) with roughly 0.5 μm of peak to valley height provided significantly increased water contact angle as compared to an unpatterned and air cured surface. (A high contact angle of water implies the water will be pinned and not move. This leads to better edge definition.) Crater width represents the width of the negative features formed in the photoresist template, from which the pillar texture features are formed in the polymer. For various feature shapes, texture feature width of 3 to 4 μm (crater dam width of 2 μm) was seen to have performed the best, with contact angles in the range of 120-125 degrees.

It is therefore important to realize that it is not, alone, the size of a feature, the shape of a feature, nor the pitch between features that is dispositive of fluid retention. Rather, it is the combination of shape (such as the shapes discussed above, and contemplating other cross-section shapes as well), a depth such as discussed above (although other depths, such as between 0.5 μm and 5 μm, and in certain embodiments between 0.5 μm and 2 μm, are also contemplated herein), and spacing such as that discussed above (although other spacings, such as between 1 μm and 6 μm, and in certain embodiments between 1 μm and 5 μm, are also contemplated herein), that provide desirable fluid retention characteristics to the imaging blanket formed as discussed above.

It is also important to realize that certain of the feature patterns discussed above provide channels (or grooves) between the features to permit dampening fluid to disperse and to thereby avoid air bubble formation as well as fluid puddling. For example, with reference to FIG. 2, the light regions 50 shown in lines 1-3 are recesses, meaning that they form raised features in the imaging surface. Therefore, the solid regions 52 of lines 1-3 form spaces between the raised features. These spaces form the aforementioned channels for dampening fluid dispersal. The orientation and placement of these channels may be designed to optimize dampening fluid and/or ink coating uniformity of the printing surface.

With reference to FIGS. 13 and 14, roughness measurements of the textured silicone imaging surface discussed above are shown in table format, sorted according to shape, feature width & feature repeat pitch. FIG. 13 illustrates that higher roughness corresponds to higher water contact angle. For example, high roughness for the honeycomb feature shape at a pitch of 6, and crater dam size of 2 μm (crater width of 3-4 μm) corresponds to the high water contact angle for the honeycomb crater shape, a pitch of 6, and size of 2 μm. The honeycomb shape appears to be a good design feature due to its two-dimensional design compactness. FIG. 14 provides a table of date as a function of varying crater widths.

Figure 15:
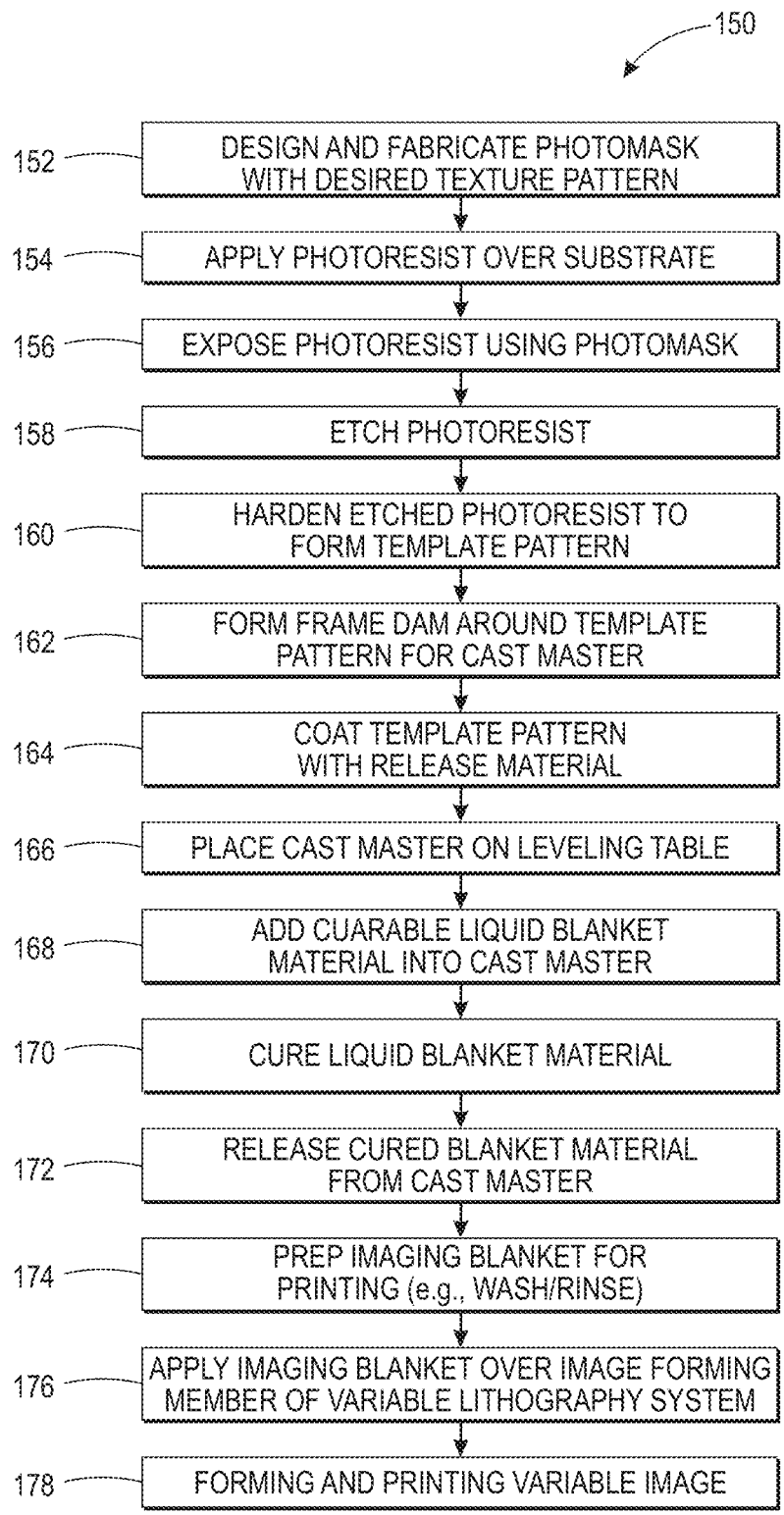
FIG. 15 is a flow chart illustrating a process for forming and implementing an imaging blanket according to another embodiment of the present disclosure.
Figure 16A:
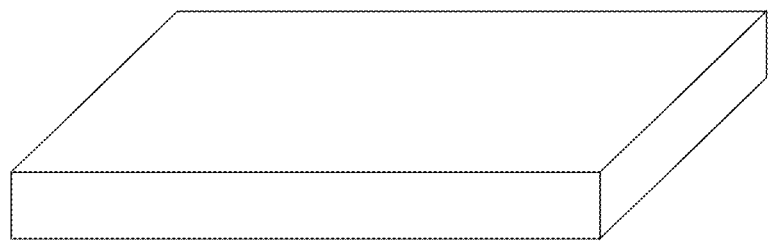
FIGS. 16A through 16I illustrate various elements of the implementation of the process shown in FIG. 15.
Figure 16B:
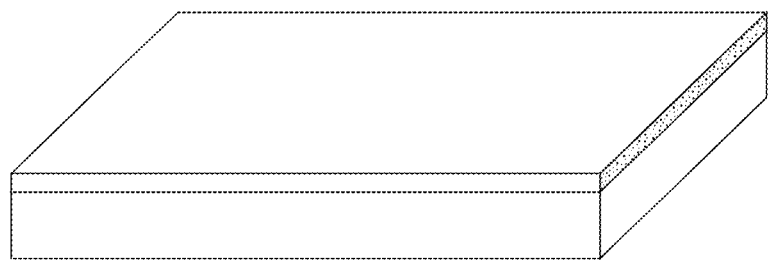
Figure 16C:
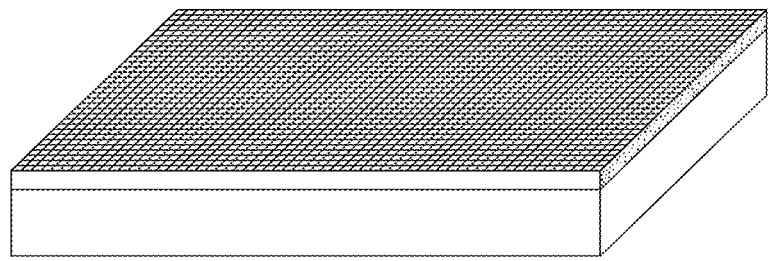
Figure 16D:
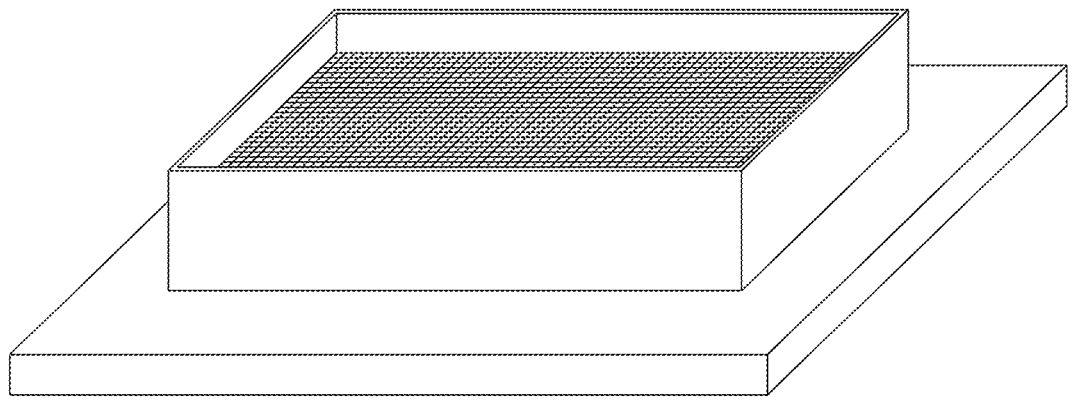
Figure 16E:
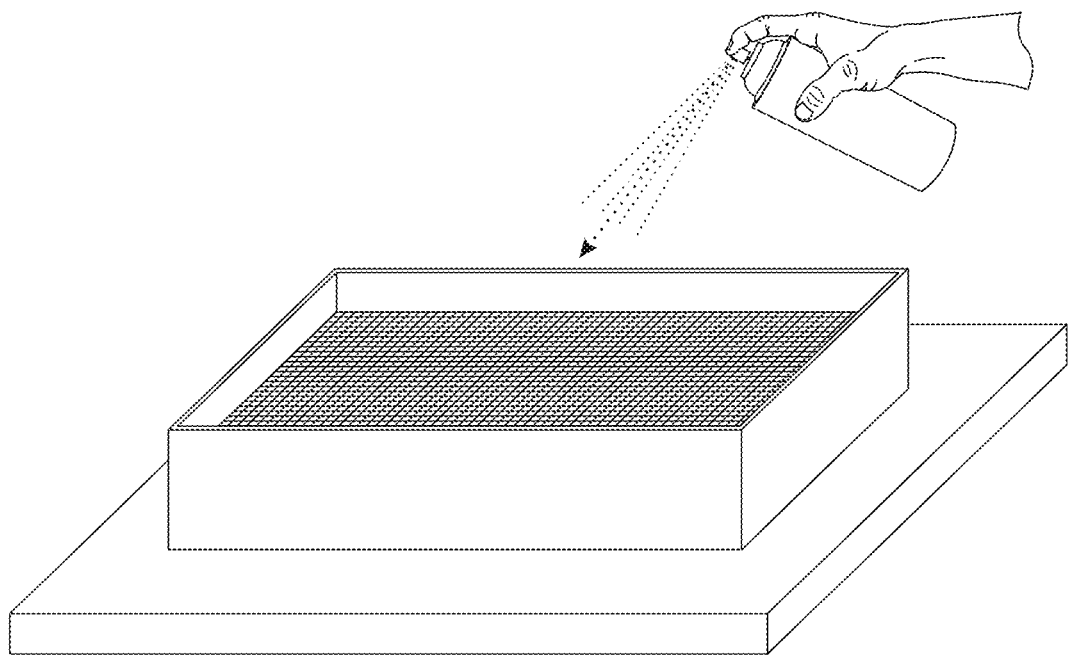
Figure 16F:
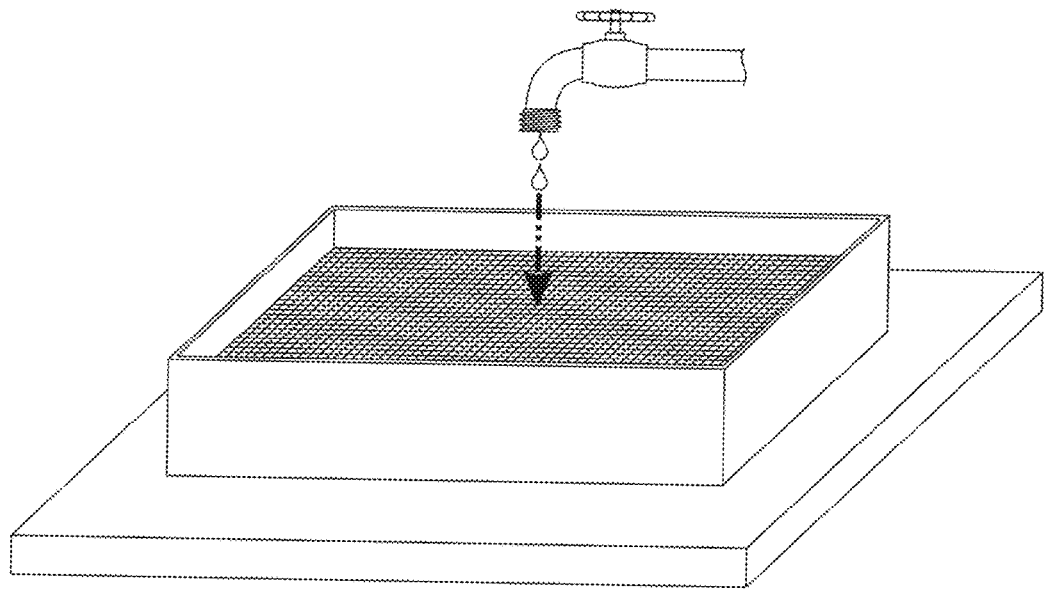
Figure 16G:
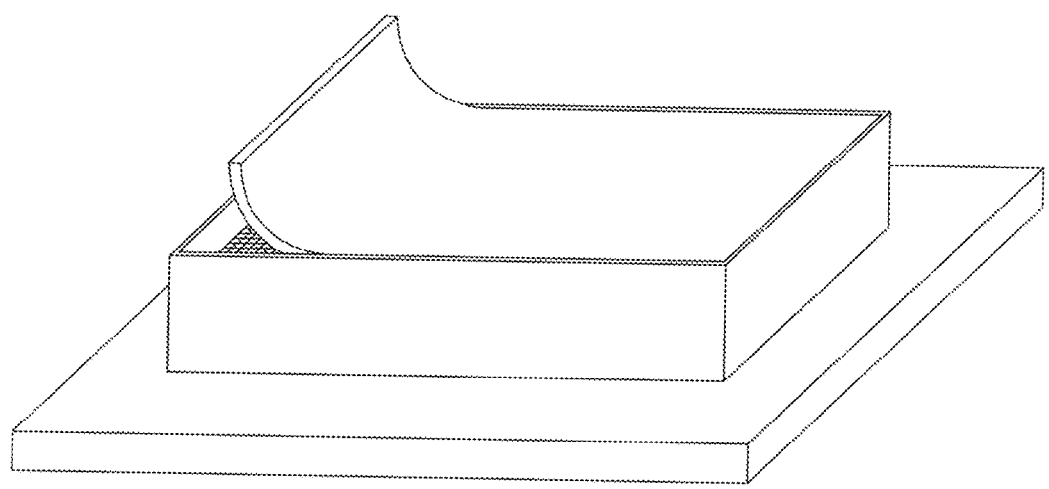
Figure 16H:
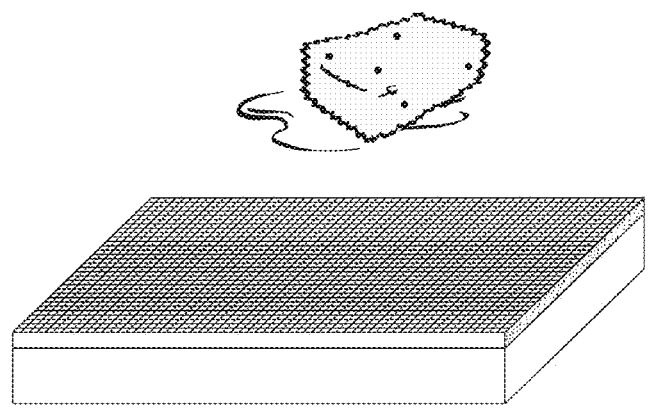
Figure 16I:
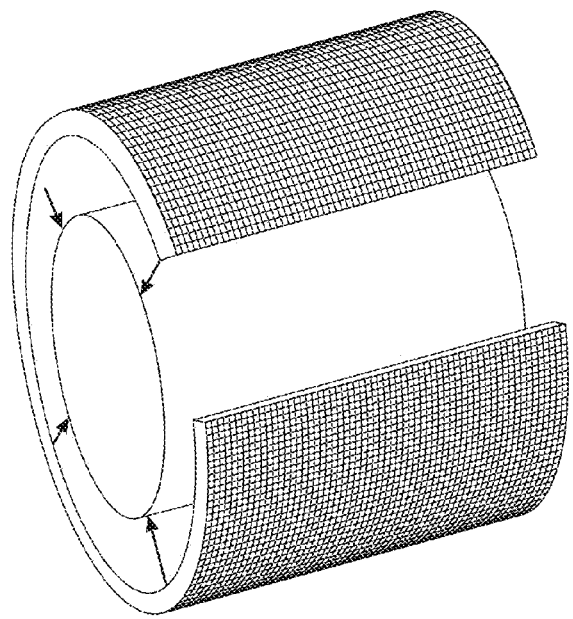

A process 150 for forming and implementing an imaging blanket according to another embodiment of the present disclosure is illustrated in FIG. 15, and the elements of that process illustrate in FIGS. 16A-16I. According to this embodiment, a photomask is designed at 152 to provide a desired texture pattern, such as the repeating pattern of honeycomb features described above, with feature-to-feature spacing (pitch) on the order of 5 μm, and in certain embodiments on the order of 1 μm. At 154, a photoresist is applied over the surface of a suitable substrate (FIGS. 16A and 16B). According to one embodiment, a polymer coated and anodized aluminum sheet is processed to strip the polymer, such as by wet polymer developer or O₂ plasma etch. The aluminum sheet is then applied to a suitably sized glass sheet. At 156 the photoresist is exposed, such as to UV radiation, using the photomask. At 158 the photoresist layer is etch by a suitable etchant. The etched photoresist layer is then hardened at 160 to form a template pattern (FIG. 16C). Optionally, the photoresist layer can be used to allow patterned etching of the substrate itself. Optionally, the template pattern may be released from the substrate, and reattached to a mold carrier, or left in place over the substrate. A molding frame dam is next formed over the template pattern at 162 to form a cast master (FIG. 16D). The frame dam will confine subsequently applied liquid polymer material to the area over the template pattern during molding. A release agent is applied over the template pattern at 164 (FIG. 16E). The cast master is disposed on a leveling table at 166. A curable polymer compound, including optional viscosity control constituents, is then applied (e.g., poured) over the cast master at 168 (FIG. 16F). The polymer compound is then cured at 170 to a desired hardness to form an imaging blanket having the negative of the template pattern molded therein. The imaging blanket may then be removed from the cast master at 172, such as by peeling back from the surface of the cast master (FIG. 16G). The imaging blanket may then be cleaned or otherwise prepared (FIG. 16H) for printing at 174, and applied over an image forming member in a variable data lithography system at 176 (FIG. 16I). Printing may then commence at 178, as discussed further below.

Figure 17:
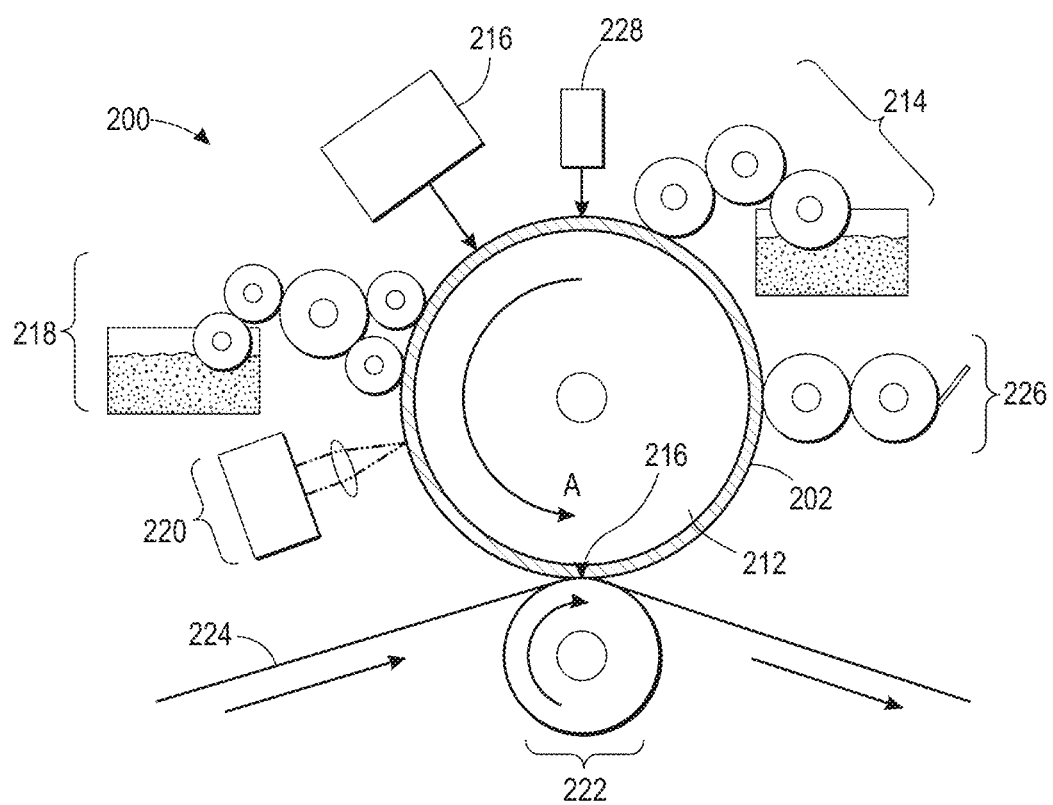
FIG. 17 is a side view of a variable data lithography system including a polymer imaging blanket, having a patterned imaging surface, affixed to a printing member therein, according to an embodiment of the present disclosure.

As mentioned, the polymer imaging blanket, having a patterned imaging surface formed by the above described molding process may be affixed to a printing member in a variable data lithography system. With reference to FIG. 17, one example of such a system 200 for variable data lithography is illustrated. System 200 comprises an imaging member 212, in this embodiment a drum, but may equivalently be a plate, belt, etc. The aforementioned polymer imaging blanket 202 may be applied over member 212, for example by an appropriate adhesive permitting temporary adhesion of blanket 202 to the surface of member 212. Blanket 202 is mounted such that the patterned imaging surface faces outward.

In certain embodiments, imaging member 212, with imaging blanket 202 applied thereto, is surrounded by one or more of: a direct-application dampening fluid subsystem 214 (although other than direct application subsystems may also be used), an optical patterning subsystem 216, an inking subsystem 218, a rheology (complex viscoelastic modulus) control subsystem 220, transfer subsystem 222 for transferring an inked image from the surface of imaging blanket 202 to a substrate 224, and finally a surface cleaning subsystem 226. Many optional subsystems may also be employed, but are beyond the scope of the present disclosure. In general, said variable data lithography system may be operated such that an image is produced by exposing a dampening fluid over said imaging blanket to radiation to thereby remove a portion of said dampening fluid, selectively forming ink in regions where said dampening fluid has been removed, and causing a substrate to be in physical contact with said ink to thereby transfer said ink from said imaging blanket to said substrate. Many of these subsystems, as well as operation of the system as a whole, are described in further detail in the aforementioned U.S. patent application Ser. No. 13/095,714.

It should be understood that when a first layer is referred to as being "on" or "over" a second layer or substrate, it can be directly on the second layer or substrate, or on an intervening layer or layers may be between the first layer and second layer or substrate. Further, when a first layer is referred to as being "on" or "over" a second layer or substrate, the first layer may cover the entire second layer or substrate or a portion of the second layer or substrate.

The physics of devices and the methods of their production are not absolutes, but rather statistical efforts to produce a desired device and/or result. Even with the utmost of attention being paid to repeatability of processes, the cleanliness of manufacturing facilities, the purity of starting and processing materials, and so forth, variations and imperfections result. Accordingly, no limitation in the description of the present disclosure or its claims can or should be read as absolute. The limitations of the claims are intended to define the boundaries of the present disclosure, up to and including those limitations. To further highlight this, the term "substantially" may occasionally be used herein in association with a claim limitation (although consideration for variations and imperfections is not restricted to only those limitations used with that term). While as difficult to precisely define as the limitations of the present disclosure themselves, we intend that this term be interpreted as "to a large extent", "as nearly as practicable", "within technical limitations", and the like.

While examples and variations have been presented in the foregoing description, it should be understood that a vast number of variations exist, and these examples are merely representative, and are not intended to limit the scope, applicability or configuration of the disclosure in any way. For example, the designed surface texture method disclosed herein can also be used to enable an Anilox- or Gravure-type of ink metering roller where the Anilox or Gravure cells are the designed ink pockets to retain the printing ink.

Various of the above-disclosed and other features and functions, or alternative thereof, may be desirably combined into many other different systems or applications. Various presently unforeseen or unanticipated alternatives, modifications variations, or improvements therein or thereon may be subsequently made by those skilled in the art which are also intended to be encompassed by the claims, below.

Therefore, the foregoing description provides those of ordinary skill in the art with a convenient guide for implementation of the disclosure, and contemplates that various changes in the functions and arrangements of the described examples may be made without departing from the spirit and scope of the disclosure defined by the claims thereto.

What is claimed is:

1. A method of forming an imaging blanket for a printing apparatus, comprising:
   depositing a photolithographically patternable material over a substrate;
   exposing said photolithographically patternable material to a desired exposure pattern;
   etching said photolithographically patternable material according to said desired exposure pattern to thereby form a template surface comprising a desired template pattern of texture features;
   forming a layer of curable liquid polymer over and in physical contact with said template surface;
   curing said liquid polymer to thereby form said imaging blanket;
   removing said imaging blanket from said template surface to thereby expose an imaging surface having a pattern of image blanket features formed therein; and
   further comprising securing said imaging blanket to an image forming member of a variable data lithography system,
   wherein said desired exposure pattern comprises a repeating pattern of said texture features, each texture feature having a substantially similar cross-sectional shape selected from the group consisting of: polygons, ovals, and circles.

2. The method of claim 1, wherein said substrate is glass.

3. The method of claim 1, wherein said photolithographically patternable material comprises photoresist.

4. The method of claim 3, wherein said photoresist is a negative, UV curable photoresist, and further where said exposure of said photoresist comprises exposure to UV radiation.

5. The method of claim 1, wherein:
   said etching removes said photolithographically patternable material such that said texture features are formed as recesses in said photolithographically patternable material, said recesses forming said pattern of features; and
   said patterned imaging surface of said imaging blanket having said pattern of image blanket features formed therein as a plurality of pillars.

6. The method of claim 5, wherein said image blanket features formed as pillars in said imaging surface have a circular cross-sectional shape, and are substantially between 1 μm and 4 μm in width, substantially between 0.5 and 2 μm in height, and spaced apart from one another substantially by no more than 6 μm.

7. The method of claim 1, wherein:
said etching removes said photolithographically patternable material such that said texture features are formed as pillars of said photolithographically patternable material over said substrate; and
said patterned imaging surface of said imaging blanket having said pattern of image blanket features formed therein as a plurality of recesses.

8. The method of claim 1, wherein said texture features are substantially uniformly spaced apart from one another by a spacing of between 1 µm and 5 µm.

9. The method of claim 1, wherein said texture features have a height of substantially between 0.5 µm and 2 µm.

10. The method of claim 1, wherein said a plurality of said texture features are formed to have a non-planar surface edge slope profile.

11. The method of claim 1, wherein said imaging blanket is formed to have channels disposed between said image blanket features.

12. The method of claim 1, further comprising operating said variable data lithography system such that an image is produced by exposing a dampening fluid over said imaging blanket to radiation to thereby remove a portion of said dampening fluid, selectively forming ink in regions where said dampening fluid has been removed, and causing a substrate to be in physical contact with said ink to thereby transfer said ink from said imaging blanket to said substrate.

13. A method of forming an imaging blanket for a printing apparatus, comprising:
depositing a photolithographically patternable material over a substrate;
exposing said photolithographically patternable material to a desired exposure pattern;
etching said photolithographically patternable material according to said desired exposure pattern to thereby form a template surface comprising a desired template pattern of texture features;
forming a layer of curable liquid polymer over and in physical contact with said template surface;
curing said liquid polymer to thereby form said imaging blanket; and
removing said imaging blanket from said template surface to thereby expose an imaging surface having a pattern of image blanket features formed therein,
wherein said desired exposure pattern comprises a pseudo-random pattern of said texture features.

14. The method of claim 13, wherein said template surface is further formed by hardening said photolithographically patternable material, following etching, over said substrate.

15. The method of claim 13, wherein said imaging blanket is formed to have channels disposed between said image blanket features.

16. The method of claim 13, further comprising securing said imaging blanket to an image forming member of a variable data lithography system.

17. A method of forming an imaging blanket for a printing apparatus, comprising:
depositing a photolithographically patternable material over a substrate;
exposing said photolithographically patternable material to a desired exposure pattern;
etching said photolithographically patternable material according to said desired exposure pattern to thereby form a template surface comprising a desired template pattern of texture features;
forming a layer of curable liquid polymer over and in physical contact with said template surface;
curing said liquid polymer to thereby form said imaging blanket; and
removing said imaging blanket from said template surface to thereby expose an imaging surface having a pattern of image blanket features formed therein,
wherein said etching further comprises etching a portion of a surface of said substrate in accordance with the patterning of said photolithographically patternable material.

18. The method of claim 17, further comprising removing said photolithographically patternable material prior to forming said layer of curable liquid polymer such that said etched surface of said substrate forms said template surface.

19. The method of claim 17, further comprising hardening said photolithographically patternable material, following etching, over said substrate such that both said hardened photolithographically patternable material and said etched surface of said substrate together form said template surface.

* * * * *